(12) United States Patent
Ng et al.

(10) Patent No.: US 8,302,242 B2
(45) Date of Patent: Nov. 6, 2012

(54) APPARATUS AND METHOD FOR CLEANING SUBSTRATES/MEDIA DISKS

(75) Inventors: Kae Jeng Ng, Selangor (MY); Kien Hui Liang, Kuala Lumpur (MY); Kien Yew Liang, Kuala Lumpur (MY)

(73) Assignee: Invenpro (M) SDN. BHD., Selangor Darul Ehsan (MY)

( * ) Notice: Subject to any disclaimer, the term of this patent is extended or adjusted under 35 U.S.C. 154(b) by 375 days.

(21) Appl. No.: 12/596,761

(22) PCT Filed: Apr. 18, 2008

(86) PCT No.: PCT/MY2008/000033
§ 371 (c)(1),
(2), (4) Date: Oct. 20, 2009

(87) PCT Pub. No.: WO2008/130215
PCT Pub. Date: Oct. 30, 2008

(65) Prior Publication Data
US 2010/0083984 A1   Apr. 8, 2010

(30) Foreign Application Priority Data

Apr. 20, 2007  (MY) .............................. PI 200700615

(51) Int. Cl.
*B08B 11/02* (2006.01)
(52) U.S. Cl. ............................................ 15/77; 15/88.3
(58) Field of Classification Search ............. 15/77, 88.3, 15/102
See application file for complete search history.

(56) References Cited

U.S. PATENT DOCUMENTS

| | | | |
|---|---|---|---|
| 5,581,837 A * | 12/1996 | Uchiyama et al. ................ | 15/77 |
| 5,675,856 A | 10/1997 | Itzkowitz | |
| 5,806,137 A | 9/1998 | Ishi et al. | |
| 6,012,192 A | 1/2000 | Sawada et al. | |
| 6,446,355 B1 | 9/2002 | Jones et al. | |
| 6,733,596 B1 * | 5/2004 | Mikhaylichenko et al. ...... | 134/6 |
| 2004/0000326 A1 * | 1/2004 | Ziemins et al. .................... | 134/6 |
| 2005/0109371 A1 * | 5/2005 | Sin et al. ............................ | 134/6 |

FOREIGN PATENT DOCUMENTS

| | | |
|---|---|---|
| EP | 0 718 871 A2 | 6/1996 |
| WO | 00/74115 A1 | 12/2000 |

* cited by examiner

*Primary Examiner* — Randall Chin
(74) *Attorney, Agent, or Firm* — Sughrue Mion, PLLC

(57) ABSTRACT

An apparatus and method for cleaning workpieces (5) using two pairs of substantially vertical rotating roller brushes (15) at each brush station whereby rotation of said brushes (15) propel workpieces (5) from one brush station to the next. Workpieces (5) are held for a predetermined period of time at each station by edgewheels (30, 31) which also rotate the workpieces (5). Cleaning fluid is sprayed onto workpieces (5) as they rotate to assist in removing particulate contamination. Method involves inserting a single workpiece (5) in between two pairs of rotating roller brushes (15) which scrub said workpiece as it is rotated by a pair of edgewheels (30, 31). There may be a divider shield (9) in between each brush station to prevent a large proportion of particulate matter and used cleaning fluid from traveling between the brush stations.

27 Claims, 13 Drawing Sheets

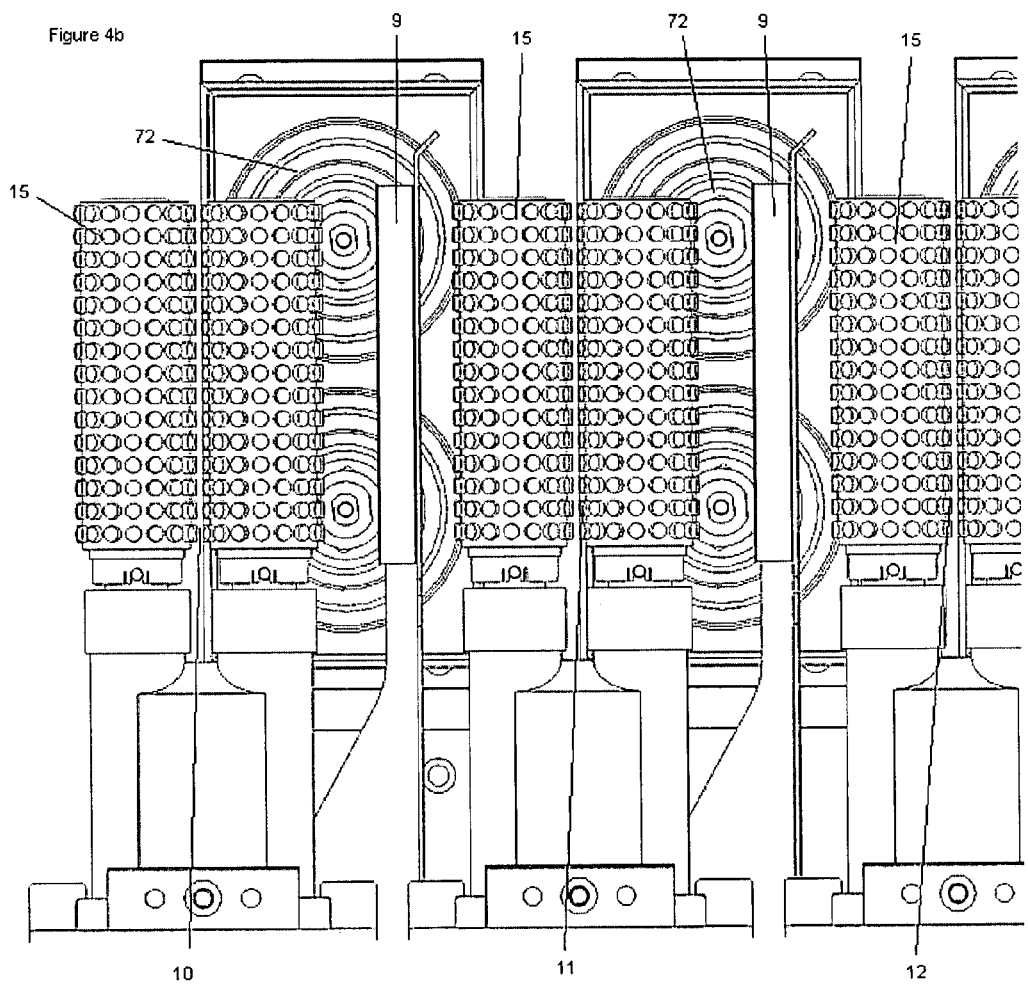

APPARATUS AND METHOD FOR CLEANING SUBSTRATES/MEDIA DISKS

FIELD OF THE INVENTION

This invention relates to an apparatus and method for cleaning substrates and/or media disks by the use of rotating roller brushes.

BACKGROUND OF THE INVENTION

There are in the art a number of patent documents which describe workpiece cleaners using roller brushes to scrub the workpieces. One example is laid-open Japanese patent specification S61-8734 (Toshio et al) which describes a transfer member that can move a plurality of workpieces through cleaning stations with washing liquid sprayed onto the workpieces. The workpieces are cleaned by a roller brush.

The workpieces, which are disc shaped with a central hole, is supported at the central hole by the transfer member. This may cause a problem of the cleanliness of central hole being compromise by contact of the transfer member.

Another prior art document, United States Patent No. 2007006406 (McEntee et al) describes a horizontal scrubber type cleaning system. The workpieces are moved along stations of rotating brushes on a conveyor belt. A well known problem with this system is the slippage which can occur between conveyor belt and workpieces. Also, these types of workpiece cleaners require a complicated and often cumbersome linkage system to control movement of the member.

Another prior art example is U.S. Pat. No. 5,893,381 (Terui) which is a scrubbing method in a running liquid. This method requires the workpieces to be moved along a bath of wash liquid on carriers. These carriers are immersed in wash liquid and must be made to move the workpieces in this state, thus necessitating specialized equipment in which to do so. Furthermore, the brushes are embedded in the scrubbing means and are difficult to replace.

Another example of a similarly disadvantaged invention is U.S. Pat. No. 7,155,767 which uses a pair of annular plate scrubbers to clean the workpiece by conveying the workpiece towards an opposite rotating scrubber.

There is still a need for equipment with which to transport the workpiece, and this is adds to cost as well as increases need for maintenance. Moreover, this invention does not allow for easy modification for a different sized workpiece.

Generally speaking, the cleaners of this kind requires in one form or another for the workpieces to be transported around to where they are needed. This usually involves cumbersome equipment that costs more and requires higher maintenance.

It is therefore desirable to have a workpiece cleaner apparatus and method which can eliminate the need for the moving carrier or edgewheel, whilst maintaining flexibility and ease of modification to accommodate different sizes of workpieces, as well as to reduce the risk of splashing of the cleaning fluid.

SUMMARY OF THE INVENTION

It is a primary object of the present invention to provide an apparatus and method for cleaning workpieces, especially those of a substantially flat disc shape such as magnetic hard disks used for storage of information, substrates and media disks, etc.

It is another object of the present invention to provide a much simplified apparatus and method for cleaning workpieces by eliminating the need for complicated and cumbersome conveyance systems required to transport the workpieces along the cleaning process such as those that appear in some of the above mentioned prior art.

It is yet a further object of the present invention to provide an apparatus and method for cleaning workpieces with an ability to change quickly and easily for different sized workpieces.

In accordance with the present invention, these objectives are achieved by provision of an apparatus for cleaning a workpiece comprising at least one brush station, each brush station comprising: at least one pair of roller brushes, said roller brushes rotating in an mirror-like fashion with respect to each other and said roller brushes sufficiently close to one another such that when said workpiece is placed in between said roller brushes, the workpiece is scrubbed on both sides by the rotating roller brushes and said workpiece tending to move in a linear fashion in the direction of rotation of the roller brushes; and a pair of edgewheels able to move towards and away from each other, and said edgewheels located such that when the edgewheels are at a position closer with respect to each other, the edgewheels hold the workpiece in a location so that the workpiece is scrubbed by the rotating roller brushes, and at least one of said edgewheels in rotation so as to cause rotation of the workpiece at a predetermined rate, and when the edgewheels are at a position further with respect to each other the edgewheels allow the workpiece to move freely in between the edgewheels.

In one specific embodiment of the present invention, there are two pairs of roller brushes at each of the brush stations, said two pairs of roller brushes in a substantially rectangular configuration and sufficiently close to each other such that when said workpiece is placed in between said roller brushes, the rotating roller brushes causing the workpiece to move in the direction of rotation, and the said edgewheel when at the position closer with respect to each other holding the workpiece in a location substantially central to the rectangle formed by the two pairs of roller brushes. Also, the said roller brushes have their axis of rotation in a substantially vertical direction.

In another specific embodiment of the present invention, there are four brush stations located in parallel to each other and such that the roller brushes in each brush station rotates at a constant speed, and the pair of edgewheels in each brush station move towards and apart from each other in a specific sequence so that a workpiece placed at a first brush station will be held there for a predetermined amount of time by the pair of edgewheels located at the first brush station until it is released by the edgewheels and moved to a second brush station where it is held by the pair of edgewheels located at the second brush station, and in this manner the workpiece moves through all four brush stations.

It is also possible to have any number of brush stations arranged in parallel and configured so a workpiece will travel through all of the brush stations after being held for a certain amount of time at each brush station by the edgewheel of that particular brush station.

The apparatus in one embodiment of the present invention comprises a divider shield in between each brush station, said divider shields having a thin opening just enough for the workpiece to move through, thus preventing a large proportion of particulate matter and used cleaning fluid from traveling between the brush stations. This divider shield may also reduce or prevent altogether any splash of the cleaning fluid that may occur.

According to the present invention, there is also provided a method for cleaning workpieces comprising:

a. placing a workpiece of a flat disc shape in between at least one pair of roller brushes, said roller brushes rotating in a mirror-like fashion with respect to each other and said roller brushes positioned close enough to each other so as to scrub the workpiece, and rotation of roller brushes causing the workpiece to move in a linear fashion in the direction of rotation;

b. holding the workpiece in this location for a predetermined amount of time by using a pair of edgewheels; and c. moving the pair of edgewheels away from each other so that the rotation of the roller brushes causes the workpiece to move away from the roller brushes.

In a more specific embodiment of the present invention, the roller brushes have their axis of rotation in a substantially vertical direction and there are two pairs of roller brushes arranged in a substantially rectangular configuration.

Yet another embodiment of the present invention is a method of cleaning a workpiece using a plurality of brush stations comprising: inserting a workpiece of a flat disc shape into a first brush station, said brush station comprising: at least one pair of roller brushes, said roller brushes rotating in a mirror-like fashion with respect to each other and said roller brushes positioned close enough to each other so as to scrub the workpiece, and rotation of roller brushes causing the workpiece to move in a linear fashion in the direction of rotation; a pair of edgewheels, said edgewheels able to move towards and away from each other, and said edgewheels located such that when the edgewheels are at a position closer with respect to each other, the edgewheels hold the workpiece in a location so that the workpiece is scrubbed by the rotating roller brushes, and at least one of said edgewheels in rotation so as to cause rotation of the workpiece at a predetermined rate, and when the edgewheels are at a position further with respect to each other the edgewheels allow the workpiece to move freely in between the edgewheels; and moving the edgewheels away from each other so that the workpiece is moved by the rotation of the roller brushes into a second brush station, wherein the roller brushes have their axis of rotation in a substantially vertical direction and there are two pairs of roller brushes arranged in a substantially rectangular configuration.

The rotation of the roller brushes and the edgewheels may be powered by one or more electric motors. A gear system may control the rotational speed of the roller brushes. Also, another gear and mechanical linkage system may control the rotational speed and position of the edgewheels.

In one embodiment of the present invention, there is one motor and belt system for each brush station.

BRIEF DESCRIPTION OF THE DRAWINGS

FIG. 4b shows a front view of an embodiment of this invention with the divider shields in place.

DETAILED DESCRIPTION OF PREFERRED EMBODIMENTS

Figure 1:
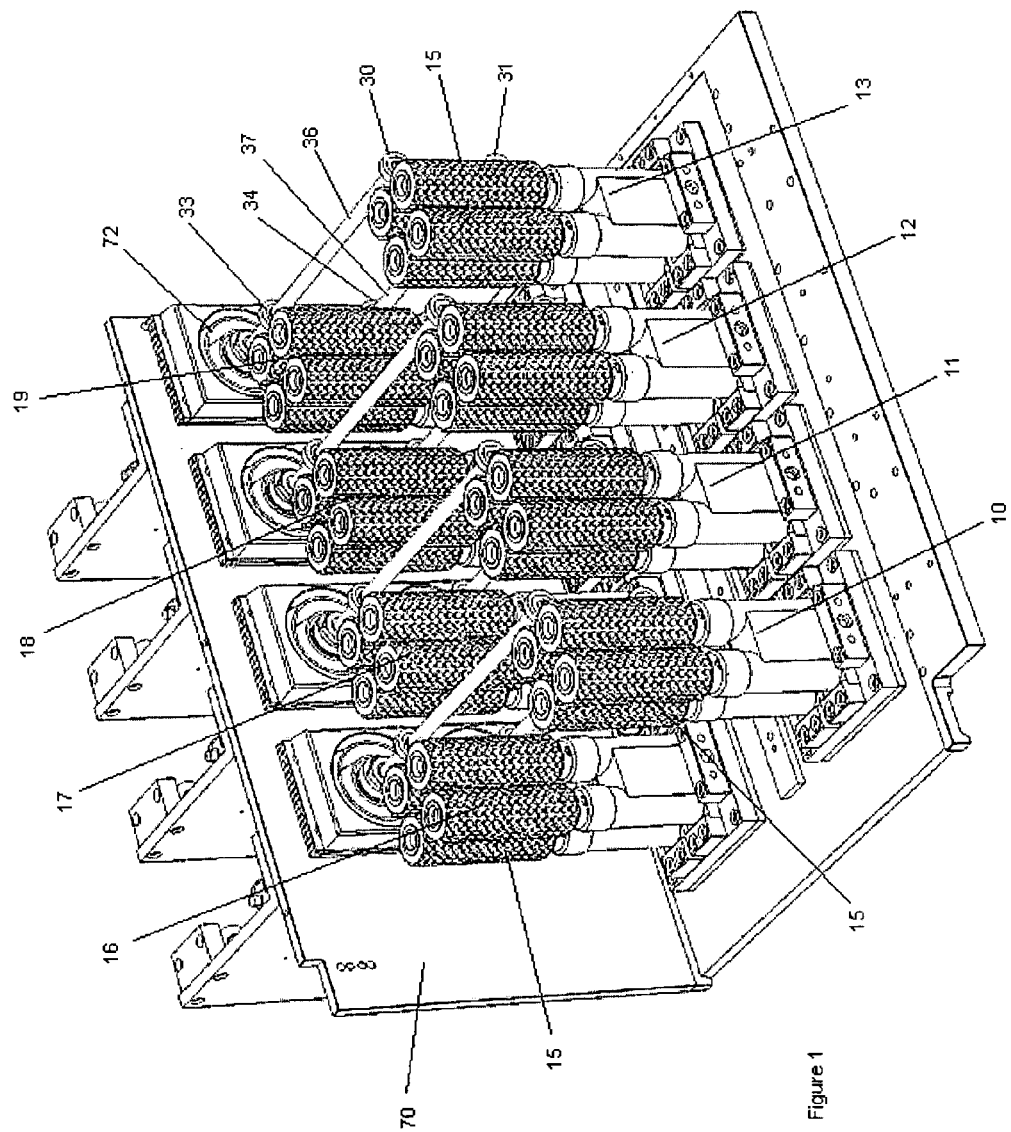
FIG. 1 shows a front perspective overall view of an embodiment of this invention.
Figure 2:
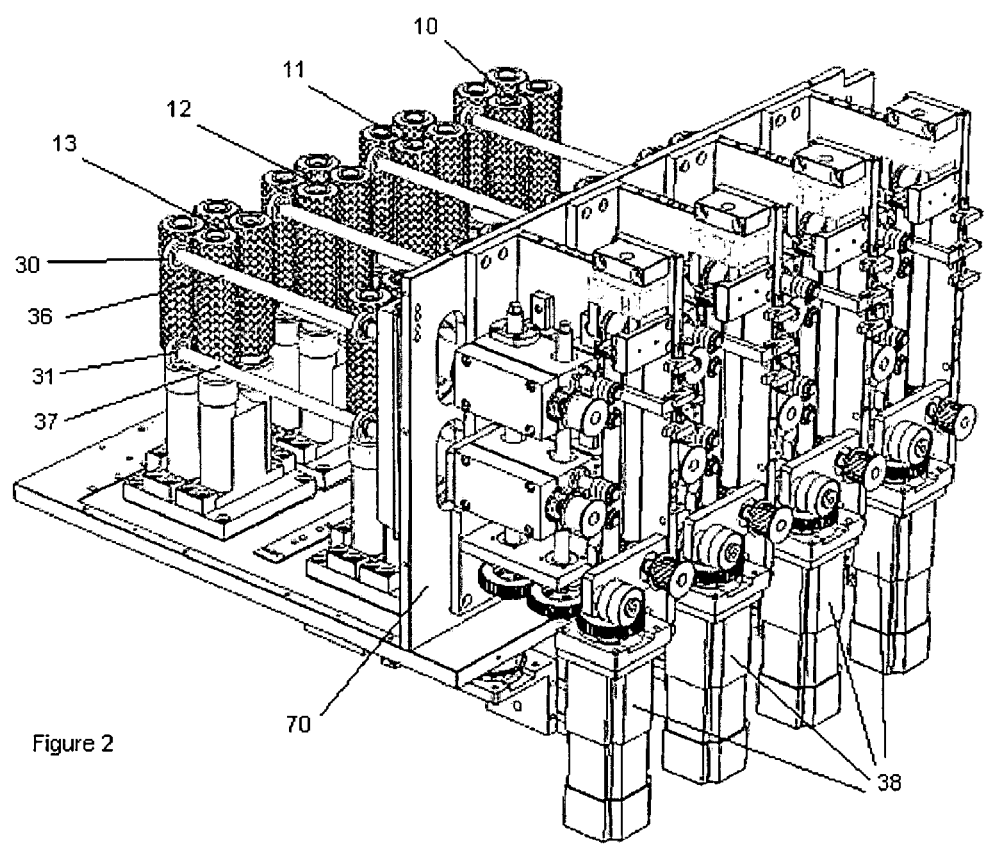
FIG. 2 shows a rear perspective overall view of an embodiment of this invention.
Figure 4A:
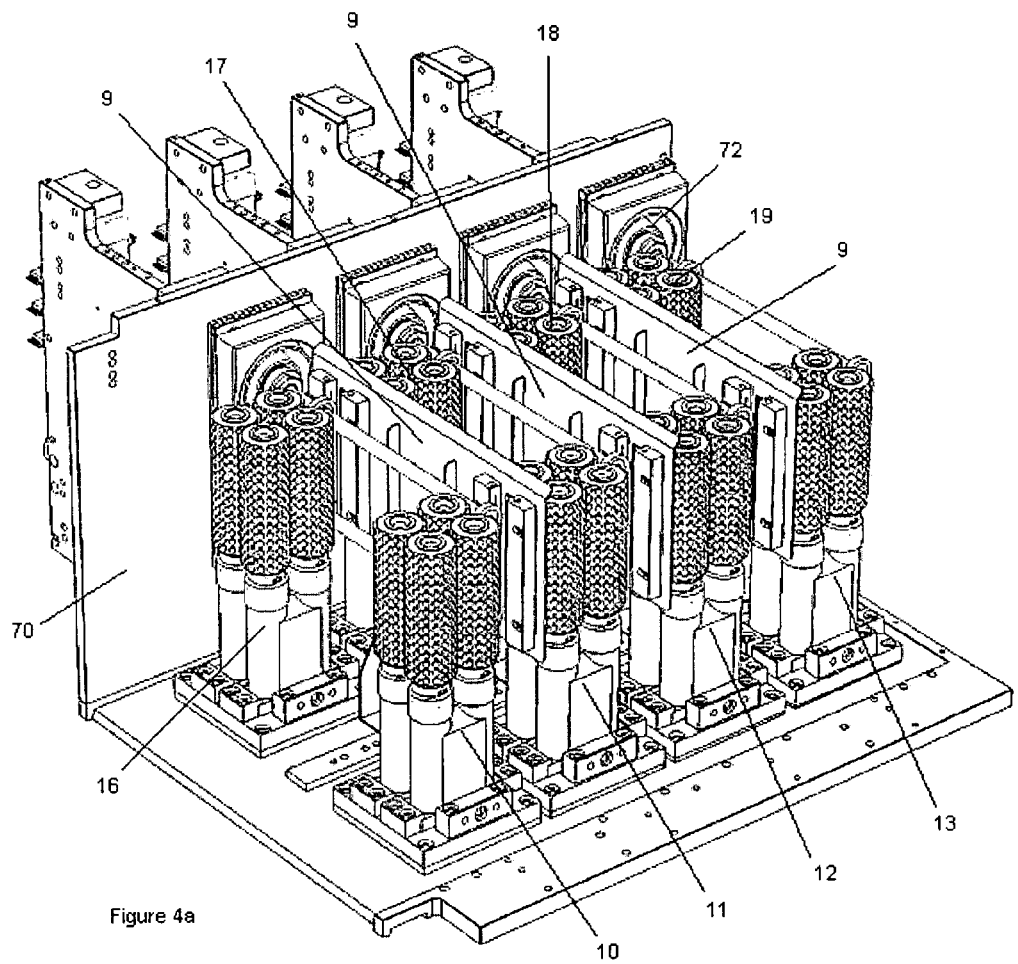
FIG. 4a shows a front perspective overall view of an embodiment of this invention with the divider shields in place.
Figure 5:
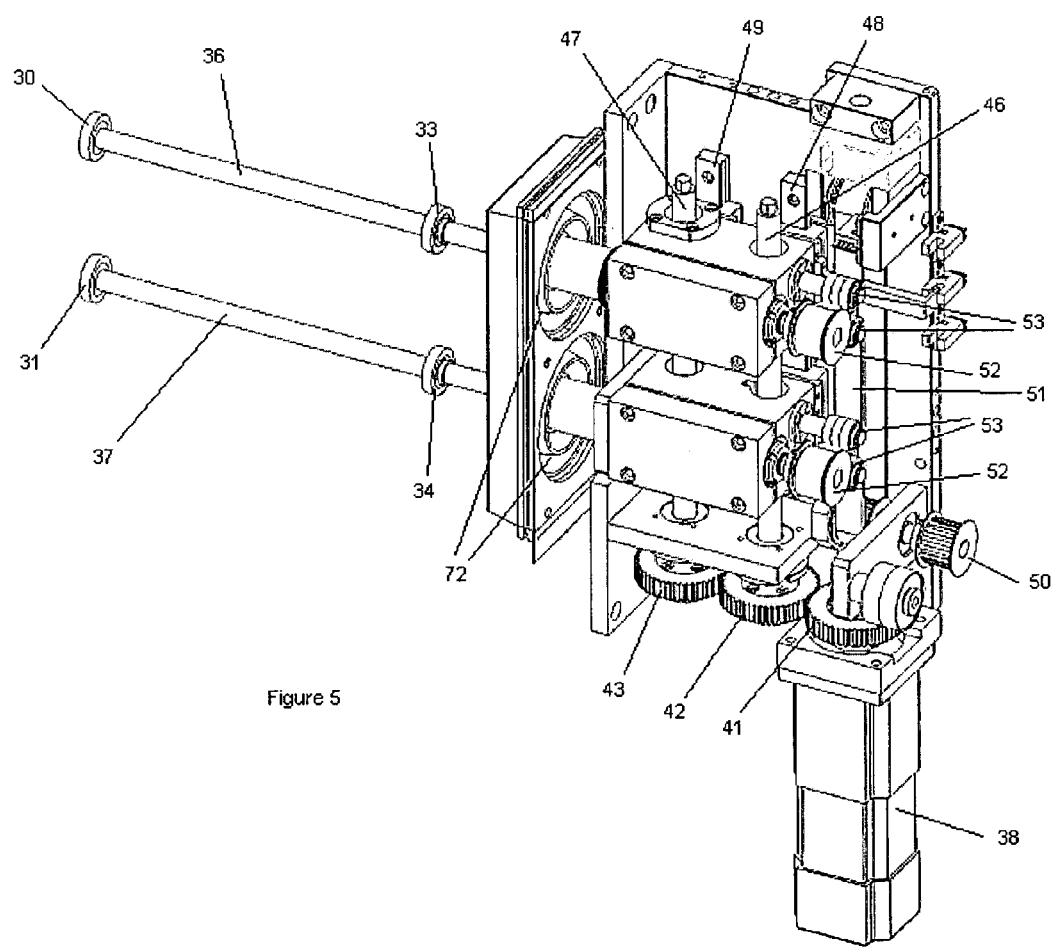
FIG. 5 shows a perspective view of the edgewheel mechanism in an embodiment of this invention.
Figure 6:
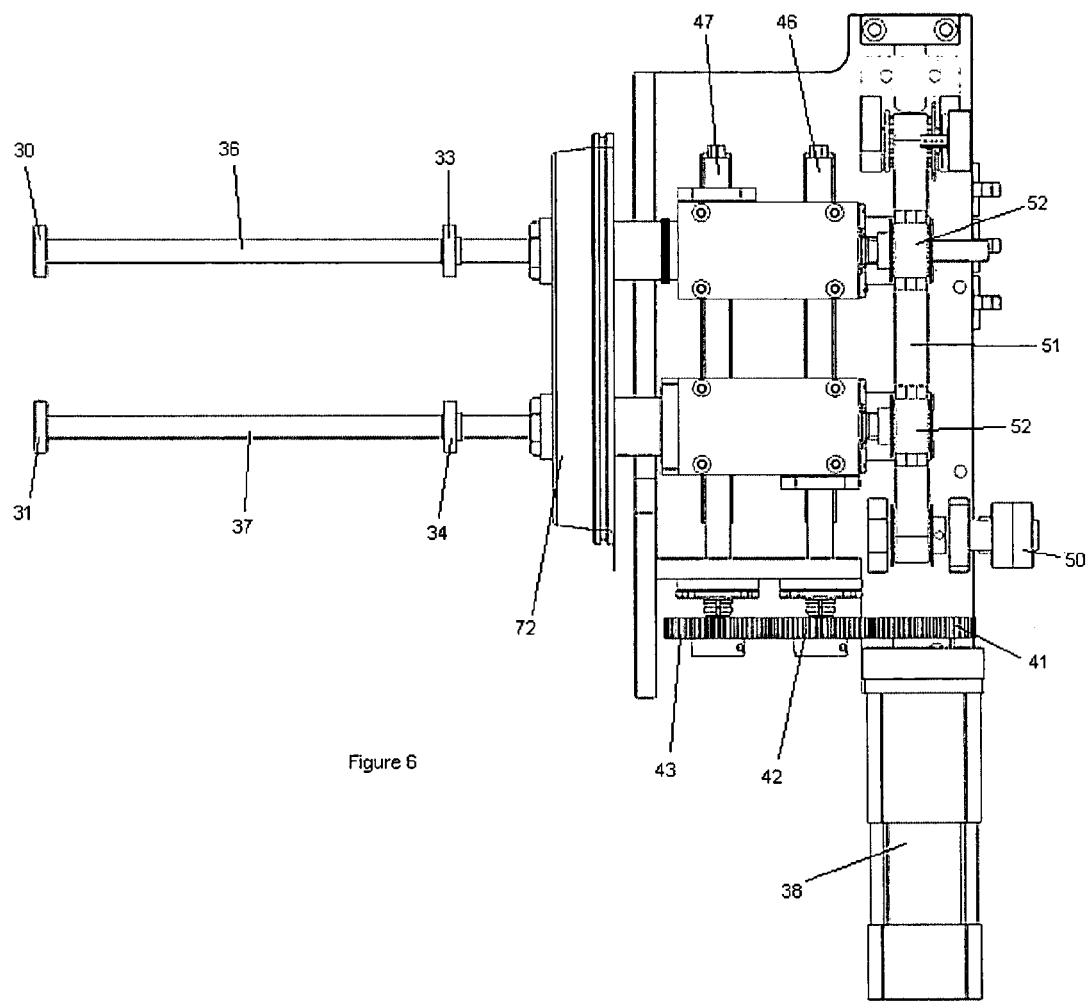
FIG. 6 shows a side view of the edgewheel mechanism in an embodiment of this invention.
Figure 7:
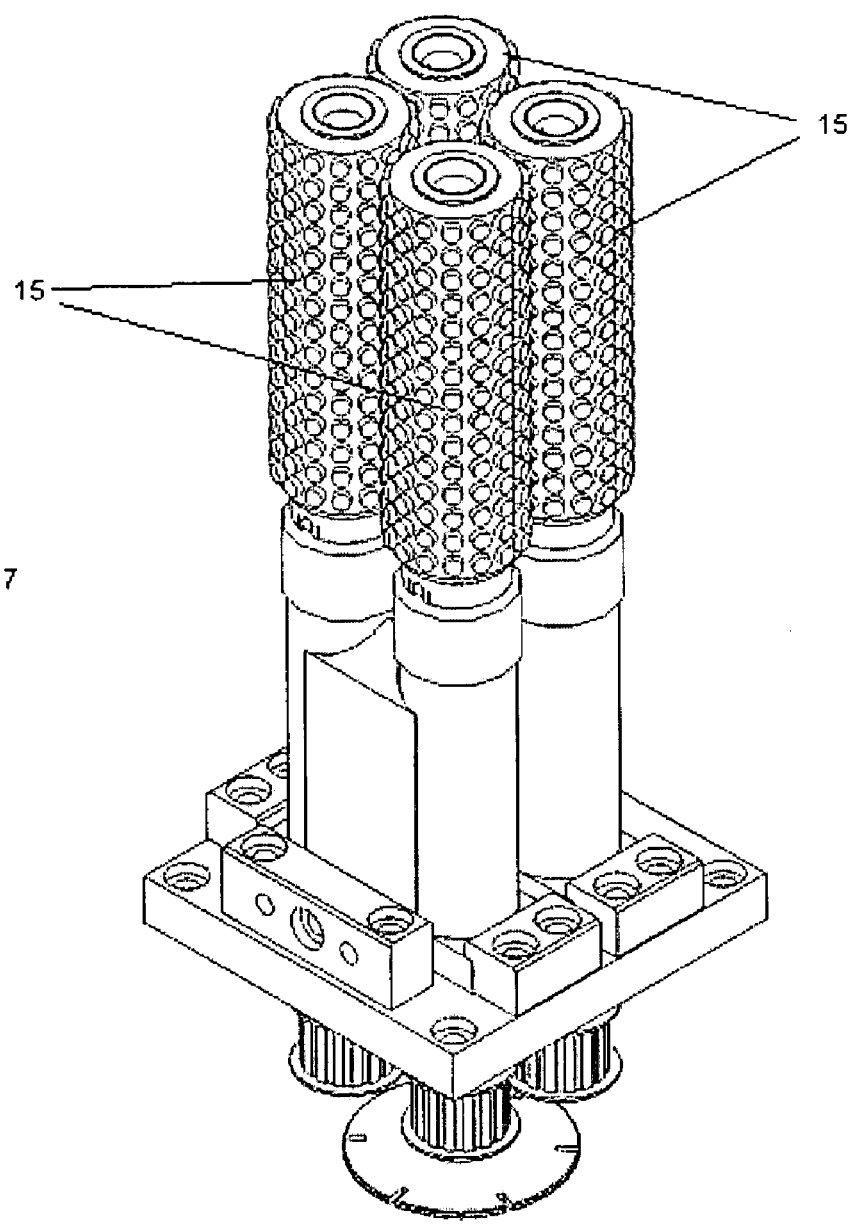
FIG. 7 shows a perspective view of a brush station in an embodiment of this invention.
Figure 8:
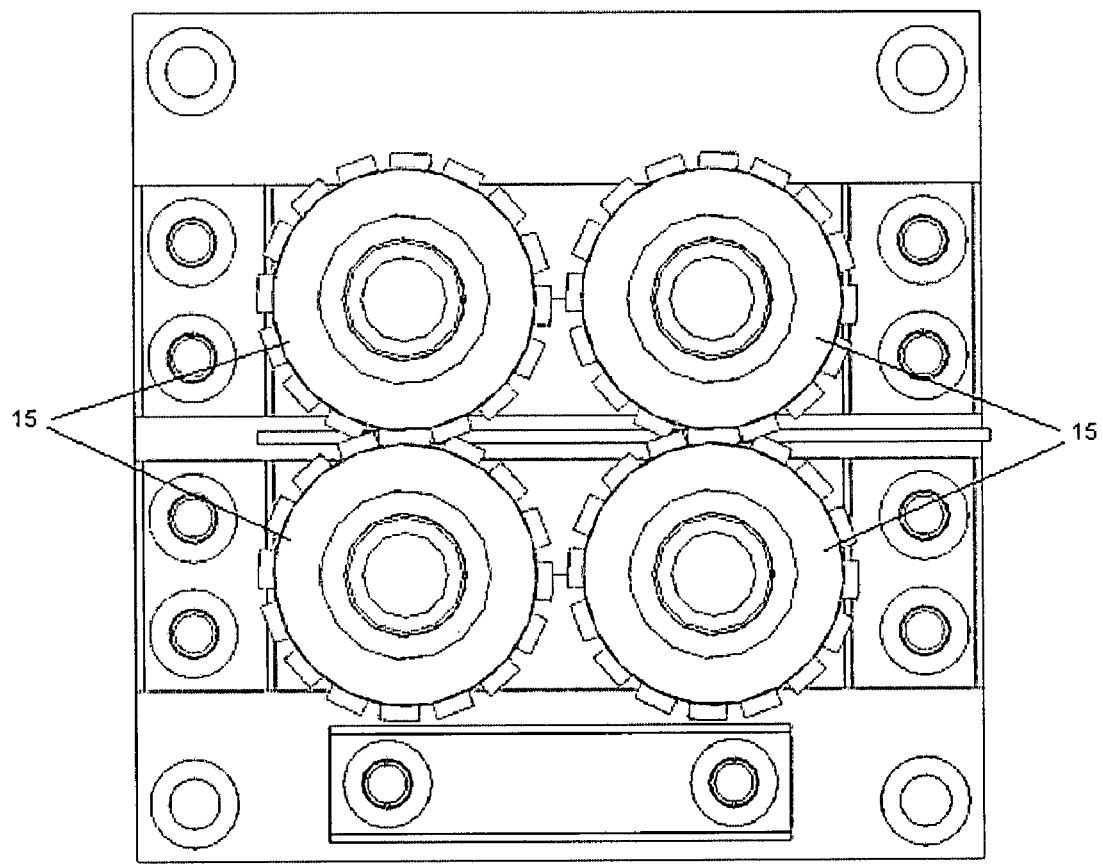
FIG. 8 shows a top view of a brush station in an embodiment of this invention.
Figure 9:
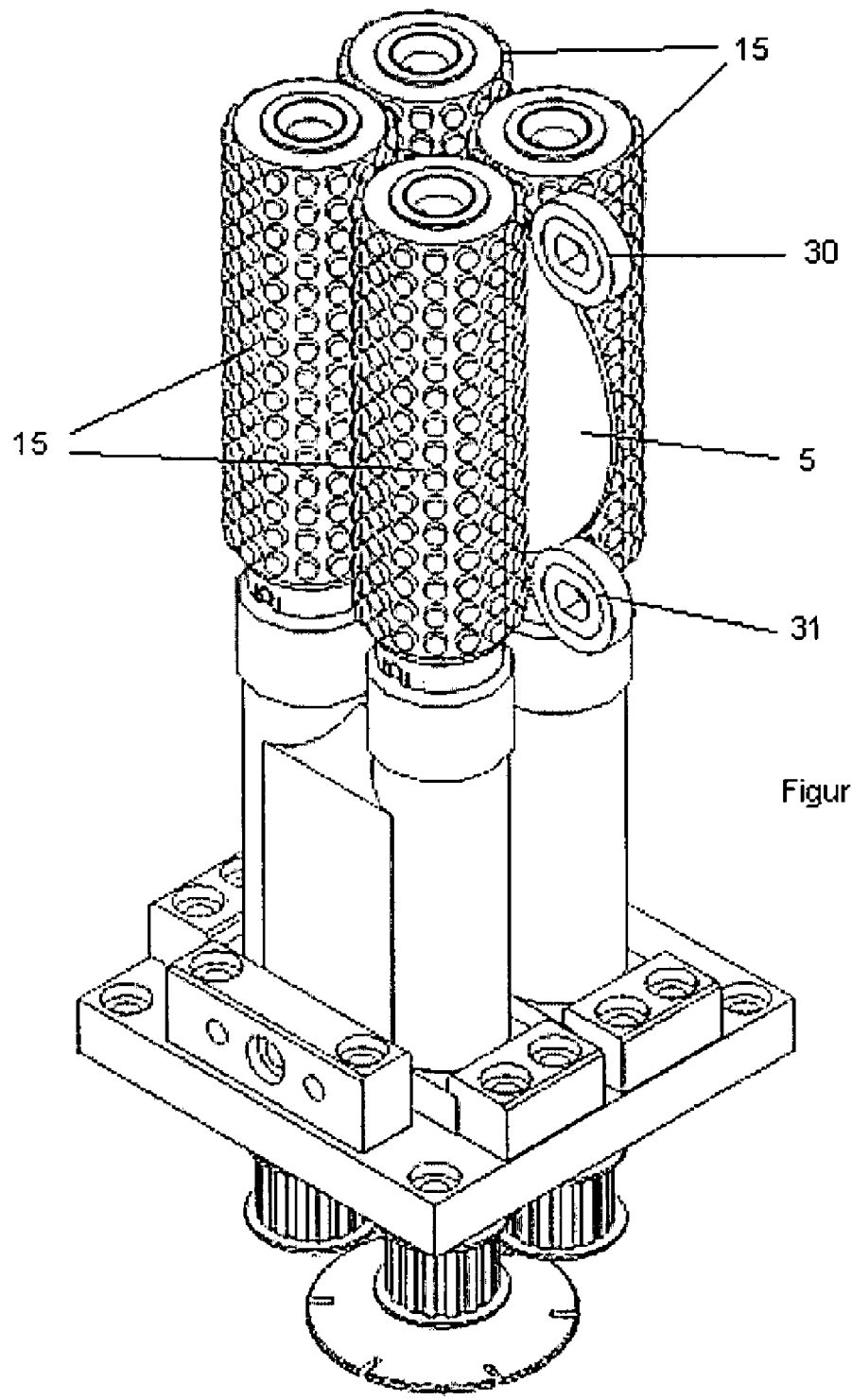
FIG. 9 shows a perspective view of a brush station with a workpiece inserted in between the roller brushes in an embodiment of this invention.
Figure 10:
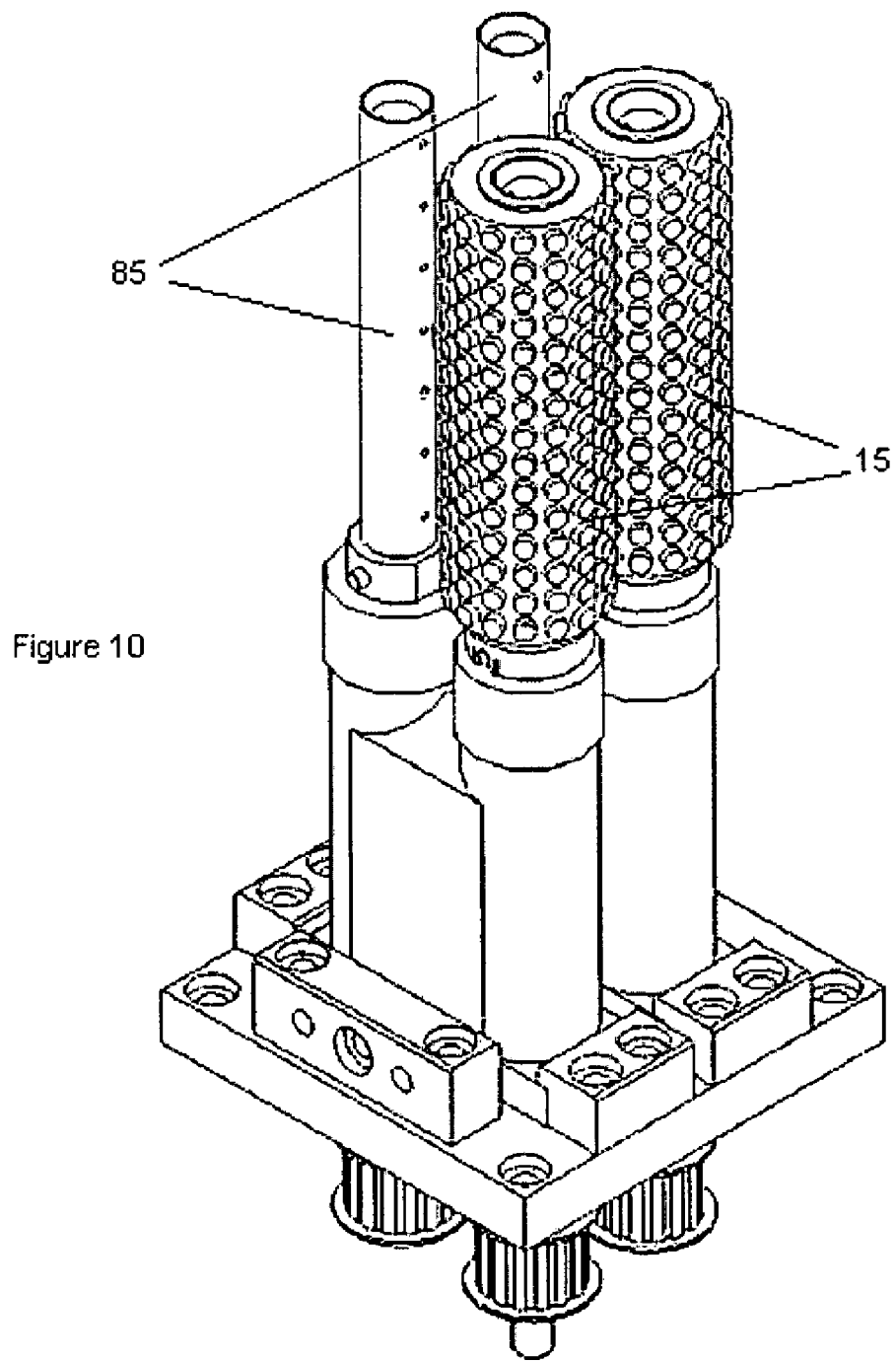
FIG. 10 shows a perspective view of a brush station with two of the roller brushes removed in an embodiment of this invention.
Figure 11:
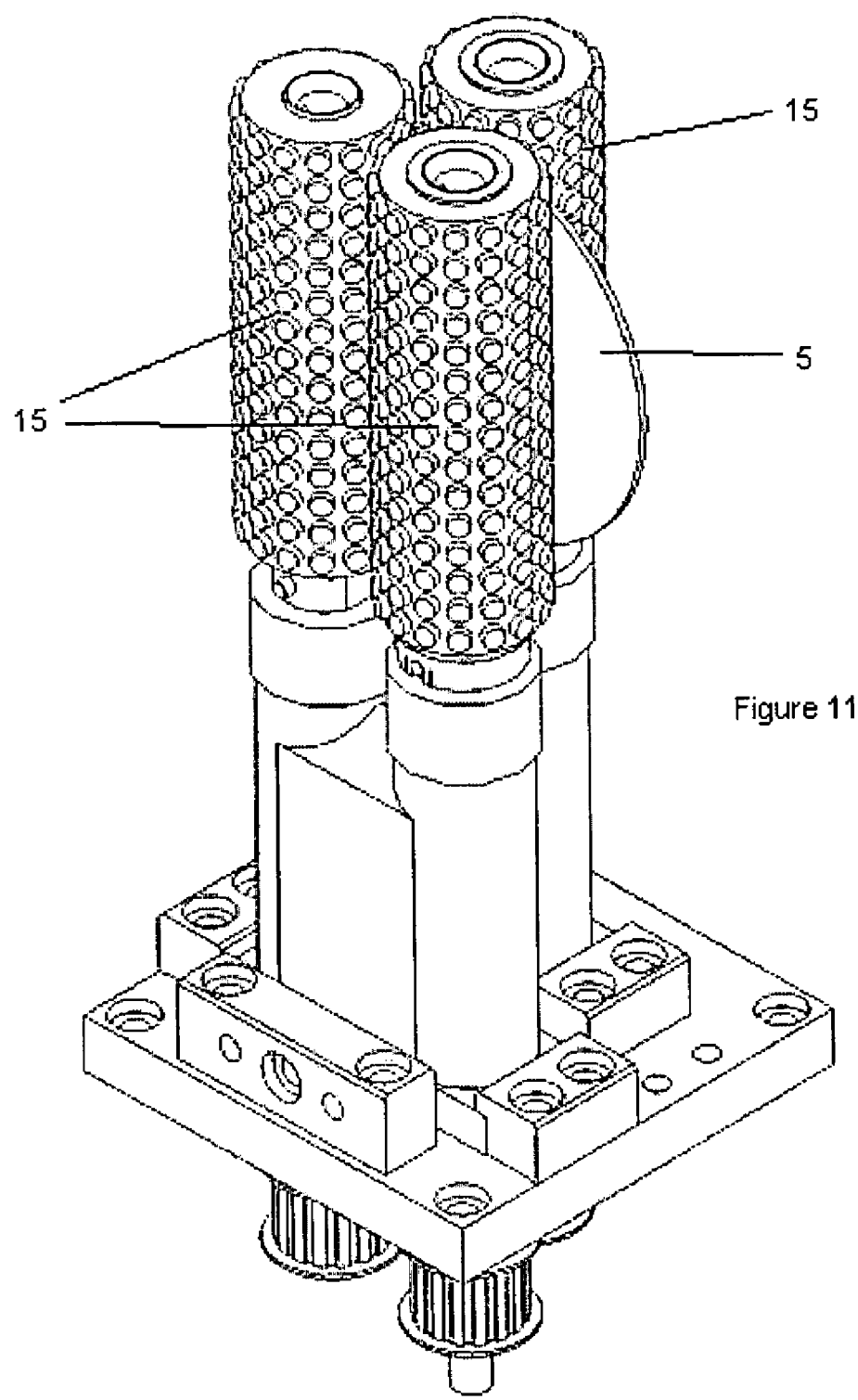
FIG. 11 shows a perspective view of a brush station with a three roller brush configuration in an embodiment of this invention.
Figure 12:
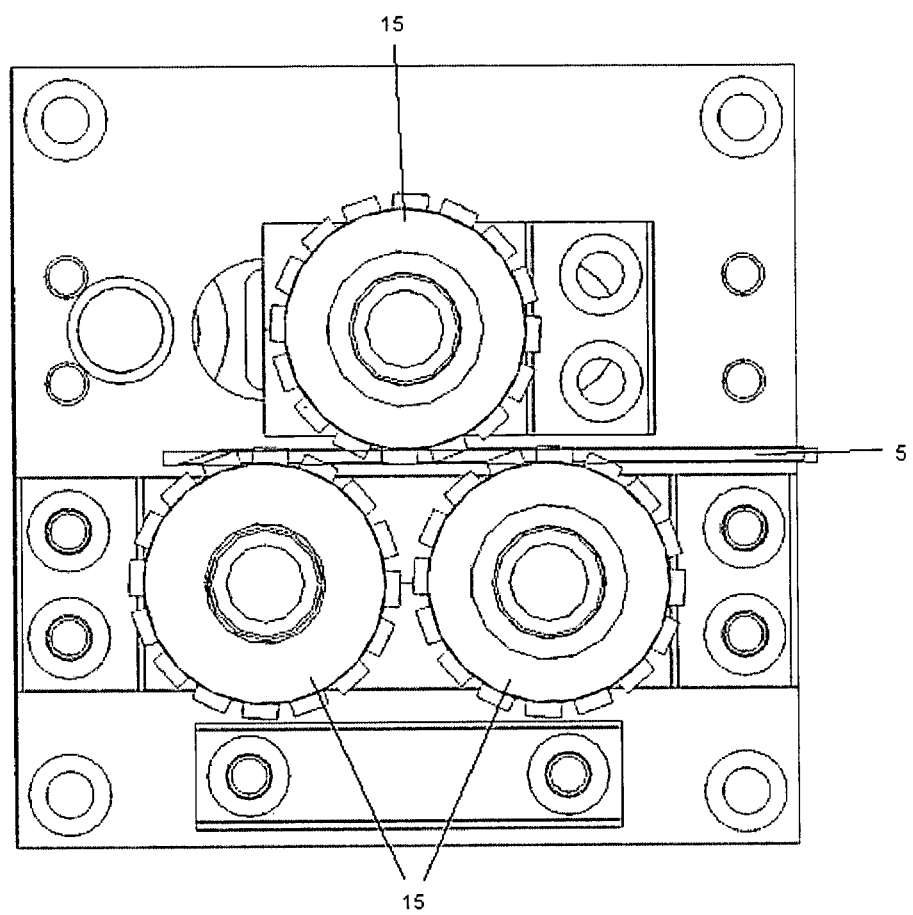
FIG. 12 shows a top view of a brush station with a three roller brush configuration in an embodiment of this invention.

A workpiece cleaning apparatus according to one embodiment of the present invention will be described with reference to the drawings. FIG. 1 shows a front perspective overall view of one of the embodiments of the present invention. FIG. 2 shows a rear perspective overall view, FIG. 3 shows a top overall view, FIG. 4a shows a front perspective overall view with the divider shields (9) in place, FIG. 4b shows a front view with the divider shields (9) in place, FIG. 5 shows a perspective view of the edgewheel mechanism, FIG. 6 shows a side view of the edgewheel mechanism, FIG. 7 shows a perspective view of the brush station, FIG. 8 shows a top view of the brush station, FIG. 9 shows a perspective view of the brush station with a workpiece (5) inserted in between the roller brushes (15), FIG. 10 shows the brush station with two of the four roller brushes (15) removed from the hollow shaft (85) within, FIG. 11 and FIG. 12 show a perspective and top view, respectively, of another embodiment of this invention whereby there are only three roller brushes (15) to each brush station.

Figure 3:
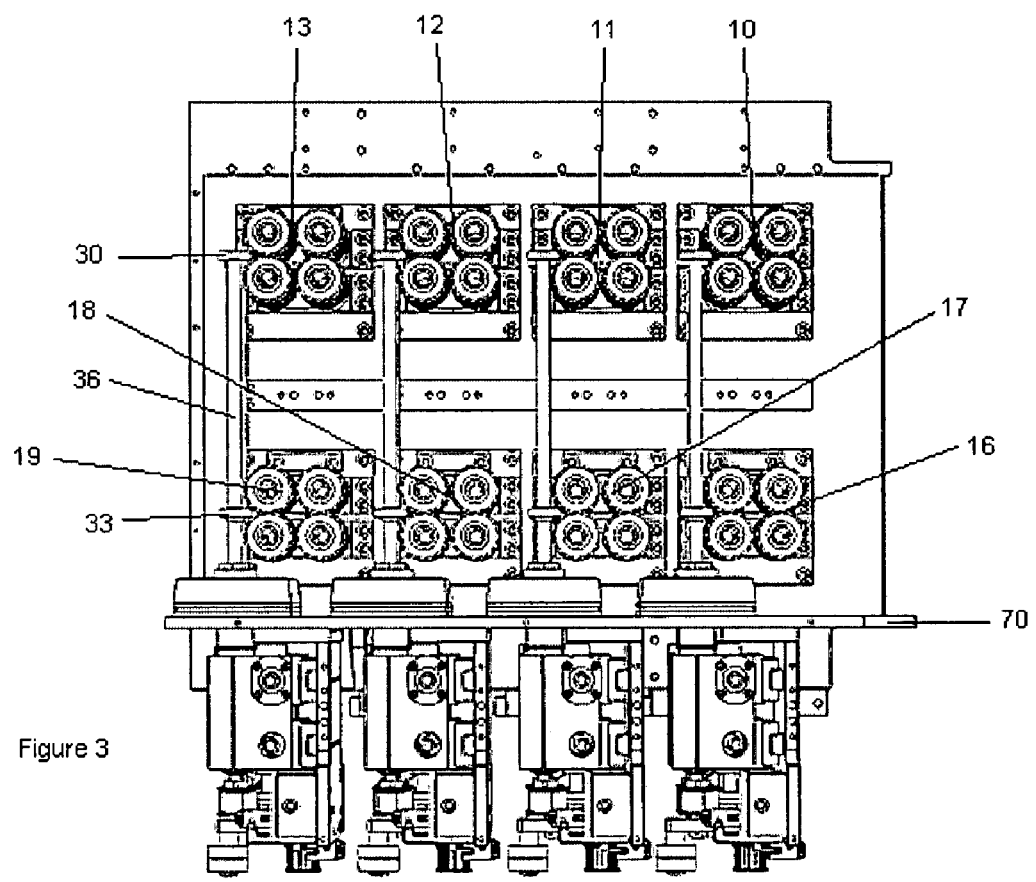
FIG. 3 shows a top overall view of an embodiment of this invention.

Referring to FIGS. 1, 2 and 3, the workpiece cleaning apparatus is constituted of two rows of four brush stations (10, 11, 12, 13 and 16, 17, 18, 19) in each row, each brush station (10) comprising two pairs of roller brushes (15) and a pair of edgewheels, with an upper edgewheel (30, 33) and a lower edgewheel (31, 34). In each row, when the apparatus is switched on, the pair of roller brushes (15) rotate in a mirror-like fashion, that is to say, in an opposite direction to each other. The pair of edgewheels (30, 31) can assume two positions: a first position, whereby the upper edgewheel (30) and lower edgewheel (31) are located closer together, and a second position, whereby the upper edgewheel (30) and lower edgewheel (31) are located further apart. The brush stations (10, 11, 12, 13) are separated from dry parts such as electric motors, belting systems, mechanical linkages and gears, etc with a water proof dividing wall (70) and bellows (72) where the edgewheel members (36, 37) puncture the said dividing wall.

In the row of brush stations (10, 11, 12, 13) further from the dividing wall (70), the edgewheels (30, 31) are connected respectively to an upper edgewheel rod (36) and a lower edgewheel rod (37) at a precise location so as to be aligned with the workpiece (5) in between the roller brushes (15). Further down both edgewheel rods (36, 37) are located another pair of edgewheels (33, 34) that are aligned to the row of brush stations (16, 17, 18, 19) closer to the dividing wall (70).

When a workpiece (5) is inserted into the first brush station (10) in between the two pairs of rotating roller brushes (15), it is immediately pulled in by the rotation of the roller brushes (15). At this point in time the pair of edgewheels (30, 31) are in the first position, whereby the upper edgewheel (30) and lower edgewheel (31) are located closer together, and hence prevent the workpiece (5) from moving out the other side of the roller brushes (15). The workpiece (5) is held at this location by the opposing forces caused by the rotation of the roller brushes (15) and the resistance provided by the pair of edgewheels (30, 31). The edgewheels (30, 31) are also in rotation in the same direction so as to cause the workpiece (5) to rotate.

After a certain amount of time, the pair of edgewheels (30, 31) assume the second position, whereby the upper edgewheel (30) and lower edgewheel (31) are located further apart. This allows the workpiece (5) to pass in between the pair of edgewheels (30, 31) and through to the second brush station (11). After this happens, the pair of edgewheels (30, 31) return to the first position, ready for another workpiece.

This process is repeated until the workpiece (5) exits the apparatus after the fourth brush station (13) and gets collected and stored in an appropriate manner.

Referring to FIGS. 4a and 4b, there is a divider shield (9) between each brush station, said divider shields having an opening for the workpiece (5) to move through. The opening is provided with a curtain of cleaning fluid which acts to prevent most of the particulate matter from traveling between the brush stations. This curtain of cleaning fluid also rinses the workpiece (5) of impurities and particulates that may be present on the said workpiece.

There is also a means of applying a cleaning fluid (not shown) at each brush station (10, 11, 12, 13) to facilitate cleaning of the workpiece (5). Referring to FIG. 10, this cleaning fluid is applied by means of a plurality of fluid injectors (not shown) located above each roller brush (15) and spraying cleaning fluid into a central cavity formed by hollow shafts (85) located within each roller brush (15). The cleaning fluid will then seep into the brushes by means of openings located along the hollow shafts (85). FIG. 10 shows the brush station with two of the four roller brushes (15) removed from the hollow shafts (85) so that the said openings are visible.

The cleaning fluid can be any one of water or detergent or a combination of these.

Referring to FIG. 5 and FIG. 6, it can be seen the mechanism that controls the movement and rotation of the edgewheels (30, 31, 33, 34). A motor (38) rotates a drive gear (41) which is in turn connected to a first spur gear (42). This first spur gear is connected to a second spur gear (43). The first spur gear (42) drives a first screw (46). The second spur gear (43) drives a second screw (47). The configuration of the gears is such that the first and second spur gears rotate in an opposite direction with respect to each other. This causes the first and second screws (46, 47) also to rotate in an opposite direction with respect to each other. The first screw (46) is connected to a threaded section of the upper edgewheel member (36), said upper edgewheel member slidably fixed to a first guide rail (48) so that when the first screw is rotated, the upper edgewheel member (36) moves in an upwards direction. Similarly, the second screw (47) is connected to a threaded section of the lower edgewheel member (37), said lower edgewheel member slidably fixed to a second guide rail (49) so that when the second screw is rotated, the lower edgewheel member (37) moves in a downwards direction. This is the mechanism that provides for the pair of edgewheels (30, 31) to move apart from each other. After a predetermined number of revolutions of the motor (38), the rotation is reversed so as to affect a reverse of this process, thus causing the pair of edgewheels (30, 31) to move towards each other.

Also in FIGS. 5 and 6 can be seen a drive gear (50) powered by a motor (not shown) and said drive gear (50) running a belt (51). When in motion, this belt (51) rotates a pair of timing pulleys (52). Each of the timing pulleys (52) are connected to an edgewheel member (36, 37) such that rotation of the timing pulleys (52) causes rotation of the edgewheel members (36, 37). Idler pulleys (53) allow the edgewheel members (36, 37) to move towards and apart from each other without substantially changing the tension of the belt (51). This is the mechanism which causes the workpiece (5) to rotate while in contact with the edgewheels (30, 31).

FIGS. 5 and 6 also show the bellows (72) which prevent cleaning fluid from passing through.

FIGS. 7 and 8 show a brush station (10, 11, 12, 13) with the roller brushes (15) installed on the hollow shafts (85).

FIG. 9 shows a brush station (10, 11, 12, 13) with a workpiece (5) in a typical location where it is scrubbed by the roller brushes (15). The rotation of the roller brushes (15) tends to propel the workpiece (5) outwards, but the pair of edgewheels (30, 31) hold the workpiece (5) in place.

FIG. 10 shows a brush station (10, 11, 12, 13) with two of the roller brushes (15) removed so that the hollow shafts (85) within are visible. The openings along the length of the hollow shaft (85) that can be seen in this drawing is for cleaning fluid to seep out to the roller brushes (15).

FIGS. 11 and 12 show a brush station with a different configuration of roller brushes (15). There are three roller brushes (15) arranged in a triangle configuration. The workpiece (5) can be seen at a location where it is to be scrubbed.

While the invention has been described with respect to specific embodiments, those skilled in the art will recognize that changes can be made in form and detail without departing from the spirit and scope of the invention. For example, the brushes, edgewheels, bases and various mechanisms may be constructed from any appropriate material. In lieu of the cleaning fluid, our invention can be used in conjunction with different types of these cleaning fluids, including water. In lieu of the size of the roller brushes, any other size may be used with the proper modification of quantities such as, but not limited to, the distance between the roller brushes and the position of the edgewheel. Accordingly, all such changes come within our invention.

The invention claimed is:

1. An apparatus for cleaning a workpiece (5), said workpiece having a substantially flat disc shape comprising at least one brush station (10, 11, 12, 13), the at least one brush station comprising:

at least one pair of roller brushes (15), said roller brushes rotating in an opposite direction with respect to each other and said roller brushes (15) sufficiently close to one another such that when said workpiece (5) is placed in between said roller brushes (15), the workpiece (5) is scrubbed on both sides by the rotating roller brushes (15) and a frictional force between the rotating roller brushes (15) and workpiece (5) propelling said workpiece (5) in the direction of rotation of the roller brushes (15);

a pair of edgewheels (30, 31) for holding the workpiece (5) in place for a predetermined amount of time and subsequently releasing the workpiece (5) to be propelled by the rotation of the roller brushes (15), said edgewheels (30, 31) are able to move towards and away from each other, and said edgewheels (30, 31) located such that when the edgewheels (30, 31) are at a position closer with respect to each other, the edgewheels (30, 31) hold the workpiece (5) in a location so that the workpiece is scrubbed by the rotating roller brushes (15), and when the edgewheels (30, 31) are at a position further with respect to each other, the edgewheels (30, 31) allow the workpiece (5) to move freely in between the edgewheels (30, 31); and wherein at least one of said edgewheels (30, 31) is in rotation so as to cause rotation of the workpiece (5) at a predetermined rate.

2. An apparatus for cleaning a workpiece (5) according to claim 1 wherein there are two pairs of roller brushes (15) at each of the at least one brush station (10, 11, 12, 13), said two pairs of roller brushes in a substantially rectangular configuration and sufficiently close to each other such that when said workpiece (5) is placed in between said roller brushes (15) and a frictional force between the rotating roller brushes (15) and workpiece (5) propelling said workpiece (5) in the direction of rotation, and said edgewheel (30, 31) when at the position closer with respect to each other holding the workpiece (5) in a location substantially central to a rectangle formed by the two pairs of roller brushes (15).

3. An apparatus for cleaning a workpiece (5) according to claim 1 wherein there are four brush stations (10, 11, 12, 13) located in parallel to each other and such that the roller brushes (15) in each brush station rotates at a predetermined speed, and the pair of edgewheels (30, 31) in each brush station move towards and apart from each other in a specific sequence so that a workpiece (5) placed at a first brush station (10) will be held there for a predetermined amount of time by the pair of edgewheels (30, 31) located at the first brush station (10) until it is released by the edgewheels (30, 31) and moved to a second brush station (11) where it is held by the pair of edgewheels located at the second brush station (11), and in this manner the workpiece (5) moves through all four brush stations (10, 11, 12, 13).

4. An apparatus for cleaning a workpiece (5) according to claim 3 wherein there are a plurality of brush stations parallel to each other.

5. An apparatus for cleaning a workpiece (5) according to claim 1 further comprising a means of rotating the roller brushes (15).

6. An apparatus for cleaning a workpiece according to claim 5 wherein said means of rotating the roller brushes (15) is at least one electrical motor.

7. An apparatus for cleaning a workpiece according to claim 6 further comprising a power transmission system connecting the at least one electrical motor to the roller brushes (15).

8. An apparatus for cleaning a workpiece according to claim 7 wherein said power transmission system comprises a belting system.

9. An apparatus for cleaning a workpiece according to claim 7 wherein said power transmission system comprises a gear system.

10. An apparatus for cleaning a workpiece according to claim 1 further comprising a means of moving the pair of edgewheels (30, 31) toward and apart with respect to one another.

11. An apparatus for cleaning a workpiece according to claim 10 wherein the means of moving the pair of edgewheels (30, 31) toward and apart with respect to one another is at least one electrical motor.

12. An apparatus for cleaning a workpiece according to claim 11 further comprising a power transmission system connecting the at least one electrical motor to said edgewheels (30, 31), said power transmission system is such that it causes the pair of edgewheels (30, 31) in each brush station (10, 11, 12, 13) to move towards and apart from each other in a specific sequence so that a workpiece (5) placed at a brush station will be held there for a predetermined amount of time by the pair of edgewheels (30, 31) located at the brush station until it is released by the edgewheels (30, 31) and moved to a next brush station and the process is repeated.

13. An apparatus for cleaning a workpiece according to claim 12 wherein said power transmission system comprises a belting system.

14. An apparatus for cleaning a workpiece according to claim 12 wherein said power transmission system comprises a gear system.

15. An apparatus for cleaning a workpiece according to claim 1 wherein each brush station has an individual electric motor.

16. An apparatus for cleaning a workpiece according to claim 1 further comprising a divider shield (9) in between each brush station, said divider shields (9) having an opening for the workpiece to move through.

17. An apparatus for cleaning a workpiece according to claim 16 wherein the opening in the said divider shield (9) is covered by a curtain of fluid.

18. An apparatus for cleaning a workpiece according to claim 17 wherein said curtain of fluid prevents most of any particulate matter from passing through.

19. An apparatus for cleaning a workpiece according to claim 17 wherein said fluid is one of water, detergent, alkaline solution, or a combination of these.

20. An apparatus for cleaning a workpiece according to claim 1 wherein each of the pairs of roller brushes are located close enough to each other so as to cause a desired amount of scrubbing on the workpieces.

21. An apparatus for cleaning a workpiece (5), said workpiece having a substantially flat disc shape comprising at least one brush station (10, 11, 12, 13), the at least one brush station comprising:

at least one pair of roller brushes (15), said roller brushes rotating in an opposite direction with respect to each other and said roller brushes (15) sufficiently close to one another such that when said workpiece (5) is placed in between said roller brushes (15), the workpiece (5) is scrubbed on both sides by the rotating roller brushes (15) and a frictional force between the rotating roller brushes (15) and workpiece (5) propelling said workpiece (5) in the direction of rotation of the roller brushes (15);

a pair of edgewheels (30, 31) for holding the workpiece (5) in place for a predetermined amount of time and subsequently releasing the workpiece (5) to be propelled by the rotation of the roller brushes (15), wherein said roller brushes (15) have their axis of rotation in a substantially vertical direction.

22. An apparatus for cleaning a workpiece (5), said workpiece having a substantially flat disc shape comprising at least one brush station (10, 11, 12, 13), the at least one brush station comprising:

at least one pair of roller brushes (15), said roller brushes rotating in an opposite direction with respect to each other and said roller brushes (15) sufficiently close to one another such that when said workpiece (5) is placed in between said roller brushes (15), the workpiece (5) is scrubbed on both sides by the rotating roller brushes (15) and a frictional force between the rotating roller brushes (15) and workpiece (5) propelling said workpiece (5) in the direction of rotation of the roller brushes (15);

a pair of edgewheels (30, 31) for holding the workpiece (5) in place for a predetermined amount of time and subsequently releasing the workpiece (5) to be propelled by the rotation of the roller brushes (15), and a means of rotating at least one of the edgewheels (30, 31).

23. An apparatus for cleaning a workpiece according to claim 22 wherein said means of rotating at least one of the edgewheels (30, 31) is at least one electrical motor.

24. An apparatus for cleaning a workpiece according to claim 23 further comprising a power transmission system connecting the at least one electrical motor to said at least one of the edgewheels (30, 31), said gear system is such that it causes the at least one of the edgewheels (30, 31) to rotate at a predetermined rate.

25. An apparatus for cleaning a workpiece according to claim 24 wherein said power transmission system comprises a belting system.

26. An apparatus for cleaning a workpiece according to claim 24 wherein said power transmission system comprises a gear system.

27. An apparatus for cleaning a workpiece according to claim 24 wherein both the edgewheels (30, 31) are caused to rotate in the same direction so as to cause the workpiece (5) to rotate.

* * * * *